(12) United States Patent
Usher et al.

(10) Patent No.: US 8,855,343 B2
(45) Date of Patent: Oct. 7, 2014

(54) METHOD AND DEVICE TO MAINTAIN AUDIO CONTENT LEVEL REPRODUCTION

(75) Inventors: John Usher, Montreal (CA); Steven Goldstein, Delray Beach, FL (US)

(73) Assignee: Personics Holdings, LLC., Boca Raton, FL (US)

( * ) Notice: Subject to any disclaimer, the term of this patent is extended or adjusted under 35 U.S.C. 154(b) by 1238 days.

(21) Appl. No.: 12/323,505

(22) Filed: Nov. 26, 2008

(65) Prior Publication Data

US 2009/0220096 A1 Sep. 3, 2009

Related U.S. Application Data

(60) Provisional application No. 60/990,339, filed on Nov. 27, 2007.

(51) Int. Cl.
| | | |
|---|---|---|
| *H04R 25/00* | (2006.01) | |
| *H03G 9/18* | (2006.01) | |
| *H03G 3/32* | (2006.01) | |
| *H03G 9/00* | (2006.01) | |

(52) U.S. Cl.
CPC . *H03G 3/32* (2013.01); *H03G 9/18* (2013.01); *H03G 9/005* (2013.01)
USPC .............................. 381/317; 381/57; 381/107

(58) Field of Classification Search
USPC .......................................... 381/104, 106, 107
See application file for complete search history.

(56) References Cited

U.S. PATENT DOCUMENTS

| | | |
|---|---|---|
| 4,430,754 A | 2/1984 | Ishigaki |
| 6,415,034 B1 | 7/2002 | Hietanen |
| 6,754,359 B1 | 6/2004 | Svean et al. |
| 2003/0144603 A1 | 7/2003 | Zoth et al. |
| 2005/0058313 A1* | 3/2005 | Victorian et al. ............. 381/315 |
| 2005/0111683 A1* | 5/2005 | Chabries et al. ............. 381/317 |
| 2006/0262938 A1 | 11/2006 | Gauger et al. |
| 2007/0036377 A1* | 2/2007 | Stirnemann ................... 381/315 |
| 2007/0160243 A1* | 7/2007 | Dijkstra et al. ............... 381/317 |
| 2007/0223717 A1* | 9/2007 | Boersma ......................... 381/74 |
| 2008/0137873 A1* | 6/2008 | Goldstein ....................... 381/57 |
| 2009/0010442 A1* | 1/2009 | Usher et al. .................... 381/57 |
| 2009/0129619 A1* | 5/2009 | Nordahn ....................... 381/328 |

OTHER PUBLICATIONS

Office Action for U.S. Appl. No. 11/942,370, filed Nov. 19, 2007, mailed Oct. 26, 2011.
Office Action for U.S. Appl. No. 12/165,022, filed Jun. 30, 2008, mailed Dec. 22, 2011.

* cited by examiner

*Primary Examiner* — Benjamin Sandvik
(74) *Attorney, Agent, or Firm* — Pablo Meles

(57) ABSTRACT

An earpiece and method to control a level of audio reproduction within an occluded ear canal are provided. The method includes the steps of measuring an ambient sound level from an Ambient Sound Microphone (ASM) at an entrance to an occluded ear canal, measuring a residual background noise level within an occluded ear canal from an Ear Canal Microphone (ECM), measuring a level of audio content delivered to the occluded ear canal, and adjusting a gain of the audio content so as to maintain reproduction of the audio content within a predetermined level range.

21 Claims, 14 Drawing Sheets

600

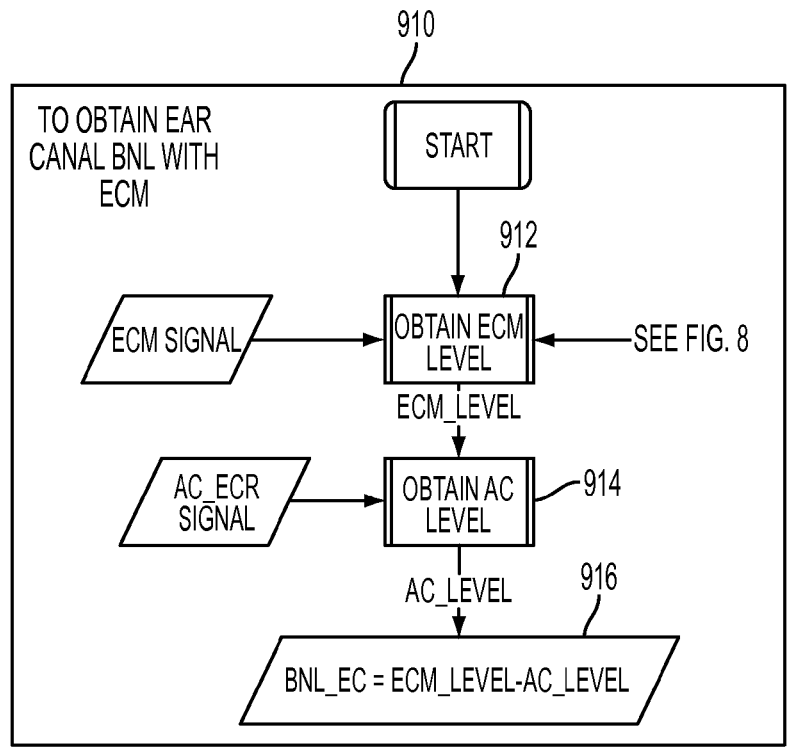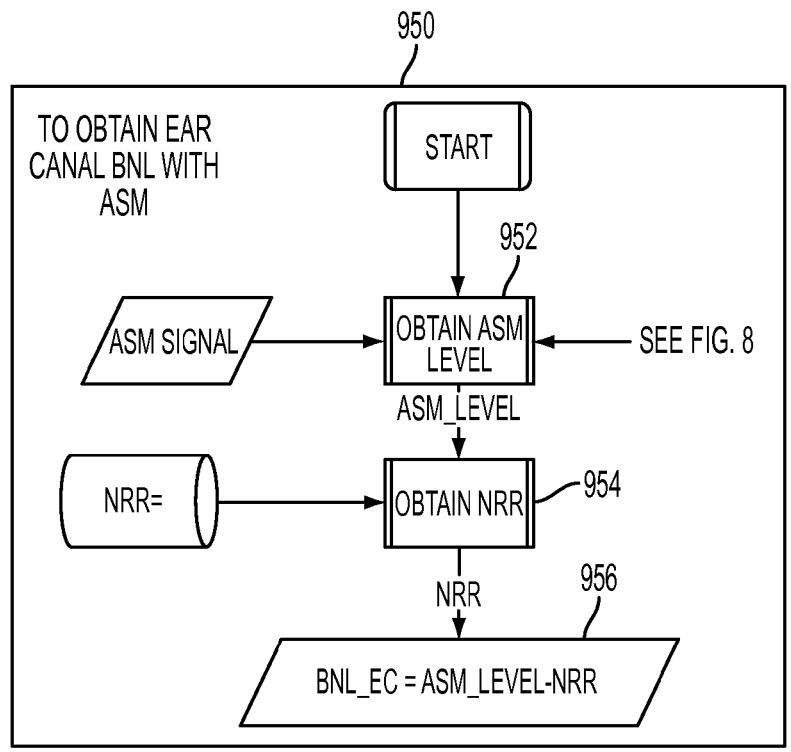
FIG. 9

1300
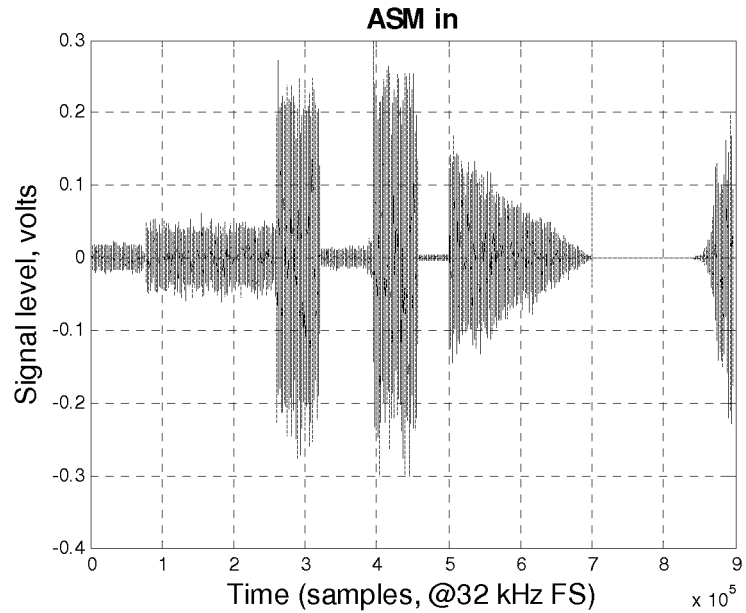
1350
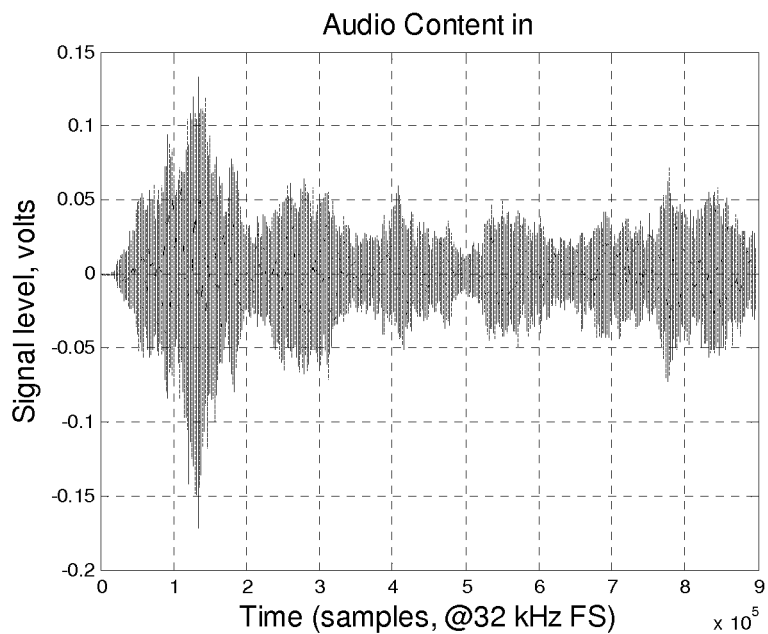
FIG. 13

METHOD AND DEVICE TO MAINTAIN AUDIO CONTENT LEVEL REPRODUCTION

CROSS REFERENCE TO RELATED APPLICATIONS

This application is a Non-Provisional Application of and claims the priority benefit of Provisional Application No. 60/990,339 filed on Nov. 27, 2007, the entire disclosure of which is incorporated herein by reference. This Application also claims the priority benefit of Provisional Application No. 60/916,271 filed on May 4, 2007, the entire disclosure of which is incorporated herein by reference. This Application also claims the priority benefit of Provisional Application No. 60/911,691 filed on Apr. 13, 2007, the entire disclosure of which is incorporated herein by reference.

FIELD

The present invention pertains to sound reproduction, sound recording, hearing loss prevention, personalized sound quality enhancement and audio communications using headsets. Particularly, the new audio system describes a method for automatically adjusting the level of an audio signal so as to enhance sound quality and protect against noise induced hearing loss,

BACKGROUND

People use portable communication devices primarily for voice communications and also recently for music listening enjoyment. In noisy conditions, background noises can degrade the quality of the music listening experience. Noise suppressors attempt to attenuate the contribution of background noise in order to enhance the listening experience. A need however exists for acoustic management control of the multiple microphones.

SUMMARY

Embodiments in accordance with the present invention provide a method and device to maintain audio content level reproduction.

In a first embodiment a method to control a level of audio reproduction within an occluded ear canal can include the steps of measuring an ambient sound level from an Ambient Sound Microphone (ASM) at an entrance to an occluded ear canal, measuring a residual background noise level within the occluded ear canal from an Ear Canal Microphone (ECM), measuring a level of audio content delivered to the occluded ear canal, and adjusting a gain of the audio content so as to maintain reproduction of the audio content within a predetermined level range. The predetermined level range can correspond to a preferred listening level initially selected by the user in a quiet environment.

The method can include measuring a digital level of the audio content prior to audible reproduction out of an Ear Canal Receiver (ECR), and compensating the level by applying an Ear Canal Transfer function (ECTF) of the occluded ear canal to the audio content to estimate the audible level within the ear canal. The audio content level can be estimated by measuring an analog level of the audio content reproduced in the occluded ear canal during periods of silence to determine the direct sound exposure, measuring an analog level of residual background noise in the occluded ear canal during periods of audio content silence to determine a secondary sound exposure, and updating the level of audio content based on the sum of the analog level of the audio content and the analog level of residual background noise. A sound exposure level within the ear canal can be assessed to ensure the gain adjustment does not exceed a safe listening level.

The step of adjusting the gain of the audio content can include increasing the gain of the audio content if a residual background noise within the occluded ear canal increases so as to achieve a constant ratio of the level of audio content to residual background noise level, or decreasing the gain of the audio content if a residual background noise within the occluded ear canal decreases so as to achieve the constant ratio. Alternatively, a pass-through gain of ambient sound from the ASM to an Ear Canal Receiver (ECR) can be adjusted to decrease a reproduction gain of the ambient sound in the occluded ear canal. Similarly, the pass-through gain can be decreased if the sound exposure level approaches or exceeds a safe listening level. As one example, the gain of the audio content can be increased, if a residual background noise within the occluded ear canal increases, so as to achieve a constant ratio of the level of audio content to residual background noise level while decreasing the pass-through gain if the sound exposure level approaches or exceeds a safe listening level.

The method can include measuring a first level of an Audio Content signal using a slow time weighting function to give a signal AC_RMS, measuring a second level of an Audio Content signal using a fast time weighting function to give a signal Frame_RMST, measuring the Ear Canal Background Noise Level to give a third level EC_BNL, and measuring a forth signal level of a processed Audio Content signal using a fast time weighting function to give a level AC_ECR.

Dynamic compression can be applied to the audio content signal to produce a modified audio content signal, where the compressing maps a first input signal level to a second output signal level at three points: an input signal level AC_LAL, which is a Lowest Audible Level of the input Audio Content signal, taken to approximate the threshold of hearing, an input level equal to a long-term RMS of the audio content signal, AC_RMS, and an input level equal to a maximum possible input level AC_PK of the audio content signal reproduced with the ECR. The maximum possible input level AC_PK should not clip, cause distortion above a predetermined level, or exceed an uncomfortable listening level. The compressing can be performed dynamically across sub-bands of the audio content signal. The audio content can be received from a mobile device, laptop, cell phone, media player, or computer.

In a second embodiment, a method to control a level of audio reproduction within an occluded ear canal can include the steps of delivering audio content to the occluded ear canal, measuring an ambient sound level from an Ambient Sound Microphone (ASM) at an entrance to an occluded ear canal, measuring a residual background noise level within the occluded ear canal from an Ear Canal Microphone (ECM), determining a sound exposure level of the audio content delivered to the occluded ear canal, and adjusting a gain of the audio content based on the residual background noise level and sound exposure level so as to maintain reproduction of audio content within a preferred listening level and within a safe listening level. The method can include identifying periods of silence in the audio content, estimating residual background noise level within the ear canal during the silence, and compensating the sound exposure level for the residual background noise level.

In a first configuration, a frequency-dependant or signal-valued attenuation of an ear sealing can be subtracted from the ambient sound level to estimate a residual background noise level within the occluded ear canal. In a second configuration, an equivalent Sound Pressure Level (SPL) of the Audio Content signal can be subtracted from the sound exposure level of the audio content to SPL_ECM to estimate a residual background noise level within the occluded ear canal.

In a third embodiment, an earpiece can include an Ambient Sound Microphone (ASM) configured to measure ambient sound at an entrance to an occluded ear canal and produce an electronic ambient signal, an Ear Canal Receiver (ECR) to deliver reproduced audio content to the occluded ear canal, an Ear Canal Microphone (ECM) configured to measure sound in the occluded ear canal and produce an electronic internal signal, and a processor operatively coupled to the ASM, the ECM and the ECR where the processor is configured to determine a residual background noise level within the occluded ear canal by way of the Ear Canal Microphone (ECM), determine a sound exposure level of the audio content delivered to the occluded ear canal, and adjust a gain of the audio content in view of the residual background noise level and sound exposure level so as to maintain reproduction of the audio content in the occluded ear canal within a preferred listening level and within a safe listening level.

The processor can apply dynamic compression to the audio content at three points along a compression curve: a first input signal level AC_LAL point, which is a Lowest Audible Level of the input Audio Content signal, taken to approximate the threshold of hearing; a second input level point equal to a long-term RMS of the audio content signal, AC_RMS; and, a third input level point equal to a maximum possible input level AC_PK of the audio content signal reproduced with the ECR. A value of an output level signal (LCL) can be approximately half a value of the residual ear canal background noise level (EC_BNL). A value of LCL can be approximately half the value of an audio content lowest audible level (AC_LAL). A value of MCL can be increased when the level difference between AC_ECR and an Ear Canal BNL (EC_BNL) is less than a predetermined threshold value C_SNR, where C_SNR is a level manually set by a user of the earpiece. A value of MCL can be decreased when a level difference between AC_ECR and Ear Canal BNL (EC_BNL) is greater than a predetermined threshold value C_SNR. A value of UCL can be derived by calculating a gradient of a slope of an input-output curve of the dynamic compression between an LCL and an MCL part of the curve, and extrapolating this curve to find the corresponding output level for AC_PK.

BRIEF DESCRIPTION OF THE DRAWINGS

FIG. 9 is a block diagram of a flow chart for calculating background noise level in an ear canal in accordance with an exemplary embodiment;

FIG. 13 presents exemplary plots of an ambient sound signal and an audio content signal in accordance with an exemplary embodiment;

DETAILED DESCRIPTION

The following description of at least one exemplary embodiment is merely illustrative in nature and is in no way intended to limit the invention, its application, or uses.

At least one exemplary embodiment is directed to an earpiece to control a level of reproduced audio content signals from portable media players or phones. The earpiece monitors ambient sound levels near-to or in the user's ear canal to adjust the level of reproduced audio content so as to maintain reproduction of audio content within a predetermined level range. The processing can maintain an ear canal signal-to-noise level consistent with predetermined user preference levels. A Hard Limit Value (HLV) can be implemented in the audio signal processing system to ensure that reproduced sound levels do not exceed the HLV value. The value of HLV can be adjusted over time to ensure that the earphone wearer's sound exposure is kept below a level which may cause hearing damage. Alternatively HLV can be set automatically, e.g. with a protected "parental control" mechanism, or set in the factory permanently. The "soft compression" mechanism implemented can ensure that sound quality is maximized even though a maximum level is limited, and allows for reproduction levels to be tailored to an individual depending on their previous sound exposure or general hearing health, age or vocation. (The threshold of hearing is approximately 30 dB SPL)

Figure 1:
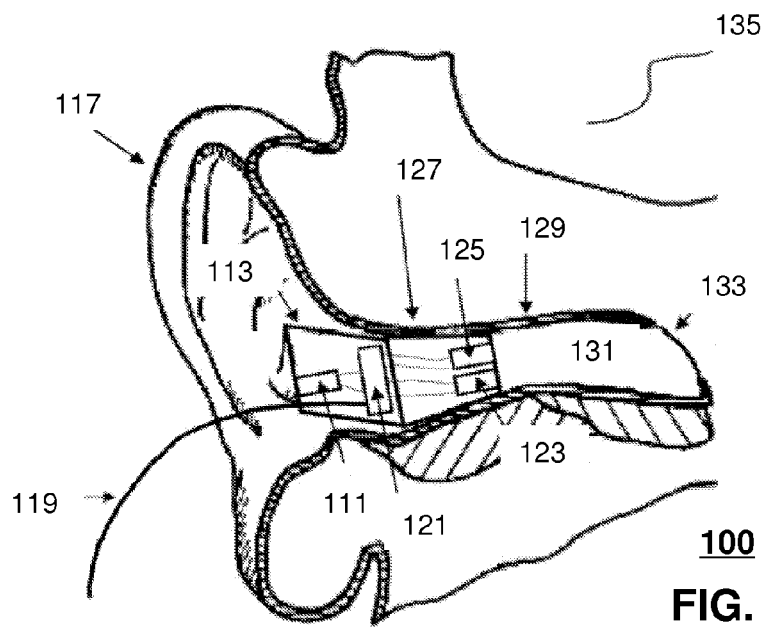
FIG. 1 is a pictorial diagram of an earpiece in accordance with an exemplary embodiment.

At least one exemplary embodiment of the invention is directed to an earpiece for sound level reproduction control. Reference is made to FIG. 1 in which an earpiece device, generally indicated as earpiece 100, is constructed and operates in accordance with at least one exemplary embodiment of the invention. As illustrated, earpiece 100 depicts an electro-acoustical assembly 113 for an in-the-ear acoustic assembly, as it would typically be placed in the ear canal 131 of a user 135. The earpiece 100 can be an in the ear earpiece, behind the ear earpiece, receiver in the ear, open-fit device, or any other suitable earpiece type. The earpiece 100 can be partially or fully occluded in the ear canal 131, and is suitable for use with users having healthy or abnormal auditory functioning.

Earpiece 100 includes an Ambient Sound Microphone (ASM) 111 to capture ambient sound, an Ear Canal Receiver (ECR) 125 to deliver audio to an ear canal 131, and an Ear Canal Microphone (ECM) 123 to assess a sound exposure level within the ear canal 131. The earpiece 100 can partially or fully occlude the ear canal 131 to provide various degrees of acoustic isolation. The assembly 113 is designed to be inserted into the user's ear canal 131, and to form an acoustic seal with the walls 129 of the ear canal at a location 127 between the entrance 117 to the ear canal 131 and the tympanic membrane (or ear drum) 133. Such a seal is typically achieved by means of a soft and compliant housing of assembly 113. Such a seal creates a closed cavity 131 of approximately 5 cc between the in-ear assembly 113 and the tympanic membrane 133. As a result of this seal, the ECR (speaker) 125 is able to generate a full range bass response when reproducing sounds for the user 135. This seal also serves to significantly reduce the sound pressure level at the user's eardrum 133 resulting from the sound field at the entrance to the ear canal 131. This seal is also a basis for, a sound isolating performance of the electro-acoustic assembly 113.

Located adjacent to the ECR 125, is the ECM 123, which is acoustically coupled to the (closed or partially closed) ear canal cavity 131. One of its functions is that of measuring the sound pressure level in the ear canal cavity 131 as a part of testing the hearing acuity of the user as well as confirming the integrity of the acoustic seal and the working condition of the earpiece 100. In one arrangement, the ASM 111 can be housed in the ear assembly 113 to monitor sound pressure at the entrance to the occluded or partially occluded ear canal 131. All transducers shown can receive or transmit audio signals to a processor 121 that undertakes audio signal processing and provides a transceiver for audio via the wired or wireless communication path 119.

The earpiece 100 can actively monitor a sound pressure level both inside and outside an ear canal 131 and enhance spatial and timbral sound quality while maintaining supervision to ensure safe sound reproduction levels. The earpiece 100 in various embodiments can conduct listening tests, filter sounds in the environment, monitor warning sounds in the environment, present notification based on identified warning sounds, maintain constant audio content to ambient sound levels, and filter sound in accordance with a Personalized Hearing Level (PHL).

The earpiece 100 can generate an Ear Canal Transfer Function (ECTF) to model the ear canal 131 using ECR 125 and ECM 123, as well as an Outer Ear Canal Transfer function (OETF) using ASM 111. For instance, the ECR 125 can deliver an impulse within the ear canal 131 and generate the ECTF via cross correlation of the impulse with the impulse response of the ear canal 131. The earpiece 100 can also determine a sealing profile with the user's ear to compensate for any leakage. It also includes a Sound Pressure Level Dosimeter to estimate sound exposure and recovery times. This permits the earpiece 100 to safely administer and monitor sound exposure to the ear.

Figure 2:
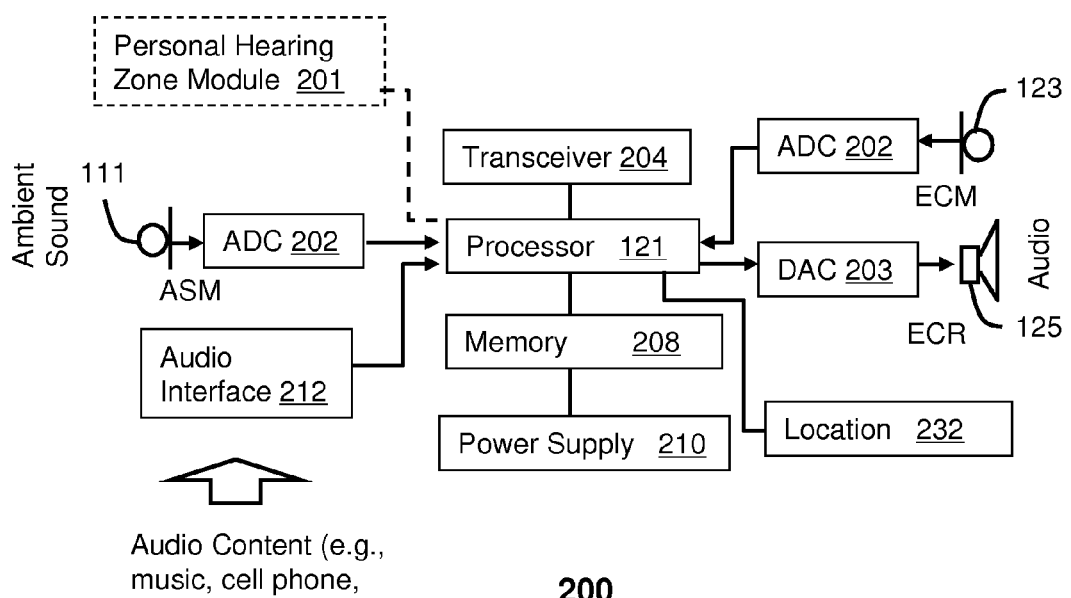
FIG. 2 is a block diagram of the earpiece in accordance with an exemplary embodiment.

Referring to FIG. 2, a block diagram 200 of the earpiece 100 in accordance with an exemplary embodiment is shown. As illustrated, the earpiece 100 can include the processor 121 operatively coupled to the ASM 111, ECR 125, and ECM 123 via one or more Analog to Digital Converters (ADC) 202 and Digital to Analog Converters (DAC) 203. The processor 121 can utilize computing technologies such as a microprocessor, Application Specific Integrated Chip (ASIC), and/or digital signal processor (DSP) with associated storage memory 208 such as Flash, ROM, RAM, SRAM, DRAM or other like technologies for controlling operations of the earpiece device 100. The processor 121 can also include a clock to record a time stamp.

As illustrated, the earpiece 100 can include Personal Hearing Zone (PHZ) module 201 to mix sounds captured at the ASM 111 and ECM 123 to produce a mixed sound. The processor 121 can then provide the mixed signal to one or more subsystems, such as a voice recognition system, a voice dictation system, a voice recorder, or any other voice related processor or communication device. The acoustic PHZ module 201 can be a hardware component implemented by discrete or analog electronic components or a software component. In one arrangement, the functionality of the PHZ module 201 can be provided by way of software, such as program code, assembly language, or machine language.

The earpiece 100 can measure ambient sounds in the environment received at the ASM 111. Ambient sounds correspond to sounds within the environment such as the sound of traffic noise, street noise, conversation babble, or any other acoustic sound. Ambient sounds can also correspond to industrial sounds present in an industrial setting, such as; factory noise, lifting vehicles, automobiles, wand robots to name a few.

The memory 208 can also store program instructions for execution on the processor 121 as well as captured audio processing data and filter coefficient data. The memory 208 can be off-chip and external to the processor 121, and include a data buffer to temporarily capture the ambient sound and the internal sound, and a storage memory to save from the data buffer the recent portion of the history in a compressed format responsive to a directive by the processor 121. The data buffer can be a circular buffer that temporarily stores audio sound at a current time point to a previous time point. It should also be noted that the data buffer can in one configuration reside on the processor 121 to provide high speed data access. The storage memory 208 can be non-volatile memory such as SRAM to store captured or compressed audio data.

The earpiece 100 can include an audio interface 212 operatively coupled to the processor 121 and PHZ module 201 to receive audio content, for example from a media player, cell phone, or any other communication device, and deliver the audio content to the processor 121. The PHZ module 201 responsive to receiving audio content from the interface 212 and an estimation of the Background Noise Level (BNL) can adjust the audio content level delivered to the ear canal to maintain a constant preferred listening level ratio. For instance, the PHZ module 201 can increase a volume of the audio content responsive to detecting an increase in BNL. The PHZ 201 by way of the ECM 123 can also actively monitor the sound exposure level inside the ear canal and adjust the audio to within a safe and subjectively optimized listening level range based on audio content volume level changes made by the PHZ module 201.

The earpiece 100 can further include a transceiver 204 that can support singly or in combination any number of wireless access technologies including without limitation Bluetooth™, Wireless Fidelity (WiFi), Worldwide Interoperability for Microwave Access (WiMAX), and/or other short or long range communication protocols. The transceiver 204 can also provide support for dynamic downloading over-the-air to the earpiece 100. It should be noted also that next generation access technologies can also be applied to the present disclosure.

The location receiver 232 can utilize common technology such as a common GPS (Global Positioning System) receiver that can intercept satellite signals and therefrom determine a location fix of the earpiece 100.

The power supply 210 can utilize common power management technologies such as replaceable batteries, supply regulation technologies, and charging system technologies for supplying energy to the components of the earpiece 100 and to facilitate portable applications. A motor (not shown) can be a single supply motor driver coupled to the power supply 210 to improve sensory input via haptic vibration. As an example, the processor 121 can direct the motor to vibrate responsive to an action, such as a detection of a warning sound or an incoming voice call.

The earpiece 100 can further represent a single operational device or a family of devices configured in a master-slave arrangement, for example, a mobile device and an earpiece. In the latter embodiment, the components of the earpiece 100 can be reused in different form factors for the master and slave devices.

Figure 3:
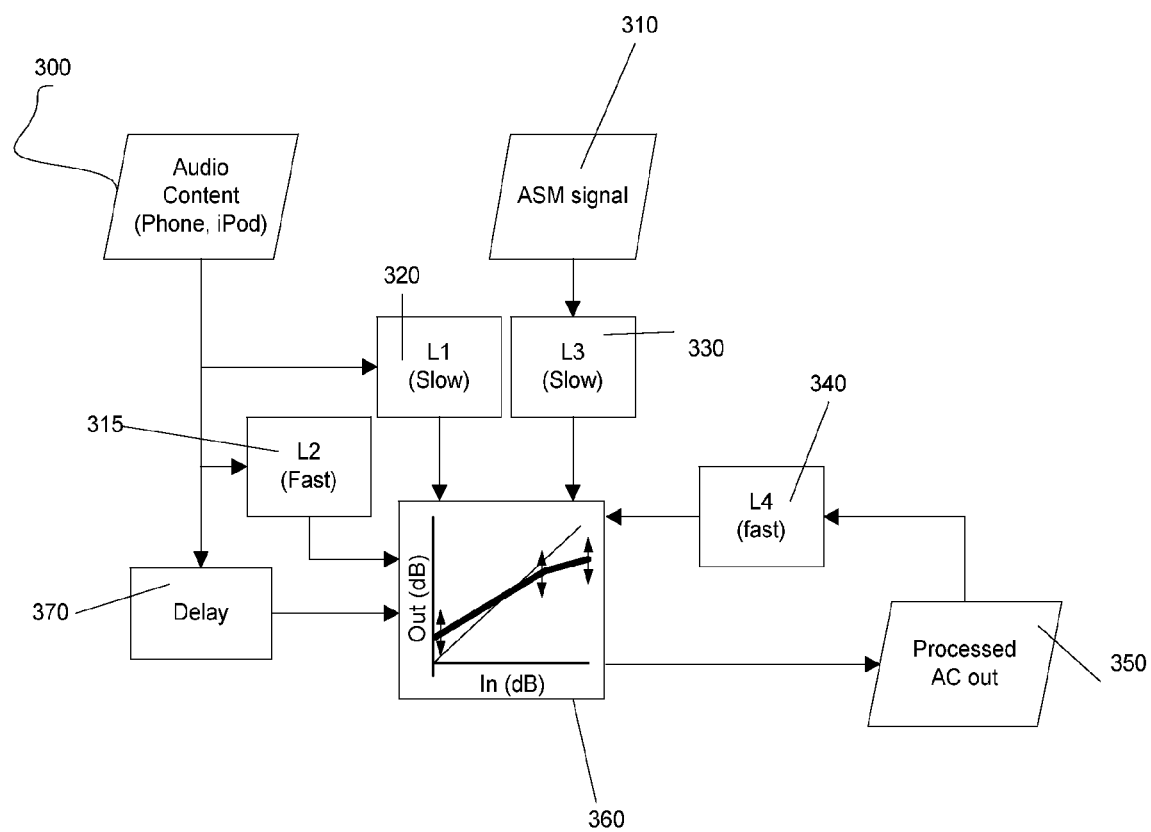
FIG. 3 is a block diagram for a Personal Hearing Zone (PHZ) module implementing dynamic compression in accordance with an exemplary embodiment.

FIG. 3 illustrates an exemplary configuration of the PHZ module (i.e., PHZ module 201 of FIG. 2) is shown. A method for modifying the original Audio Content signal 300 as performed by the PHZ module can comprise the steps of:

i. Measuring a first level of an Audio Content signal using a slow time weighting function to give a signal AC_RMS 320.

ii. Measuring a second level of an Audio Content signal using a fast time weighting function to give a signal Frame_RMS 315.

iii. Measuring the Ear Canal Background Noise Level to give a third level EC_BNL, which in this exemplary embodiment uses the ASM signal 310 to give a level 330, from which is subtracted the earplug attenuation (or Noise Reduction Rating) coefficient to give the EC_BNL.

iv. Measuring a forth signal level of a processed Audio Content signal using a fast time weighting function to give a level AC_ECR 340.

v. Processing a delayed 370 input Audio Content signal 300 with a Dynamic Compressor 360 to produce a modified audio content signal 350.

vi. Updating the Dynamic Compressor based on the four signal levels.

Figure 4:
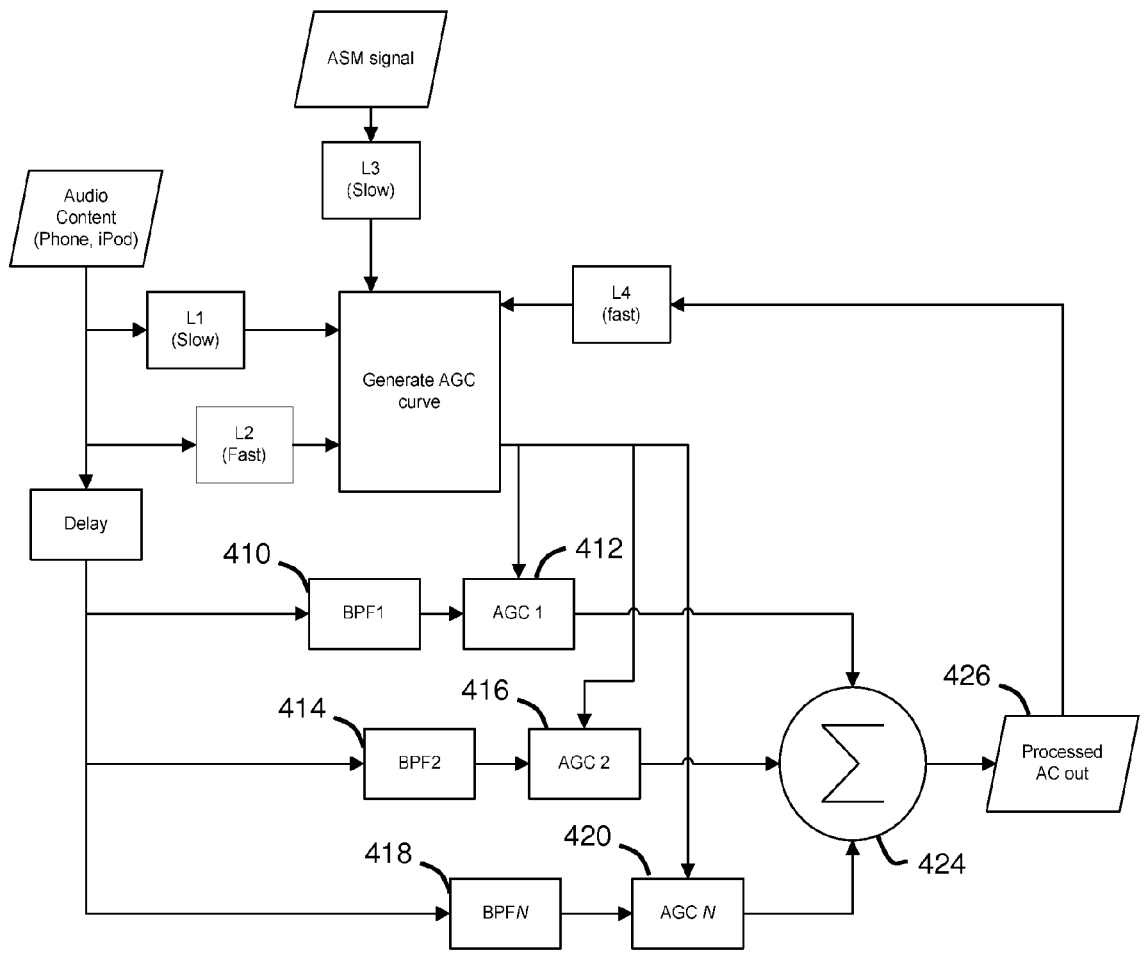
FIG. 4 is a block diagram of the PHZ module implementing sub-band dynamic compression in accordance with an exemplary embodiment.

FIG. 4 illustrates another exemplary configuration 400 of the PHZ module shown in FIG. 3 where there are multiple dynamic compressor units to process different sub-band signals of the input Audio Content Signal. (Components common in FIG. 3 are not re-numbered; only additional components associated with the multiple dynamic compressors are numbered). As shown, band-pass filters (BPFS) 410, 414, and 418 can each band-pass filter the audio content signal within a respective band (overlapping, or not, e.g., Critical band, ⅓ octave, etc.) Each BPF can have a corresponding automatic gain controller (AGC) 412, 414, 416, 420 to compress the band-pass output according to a predetermined or adaptive compression curve. The outputs of the AGC's can be summed by the combiner 424 to produce the processed audio content signal 426.

Figure 5:
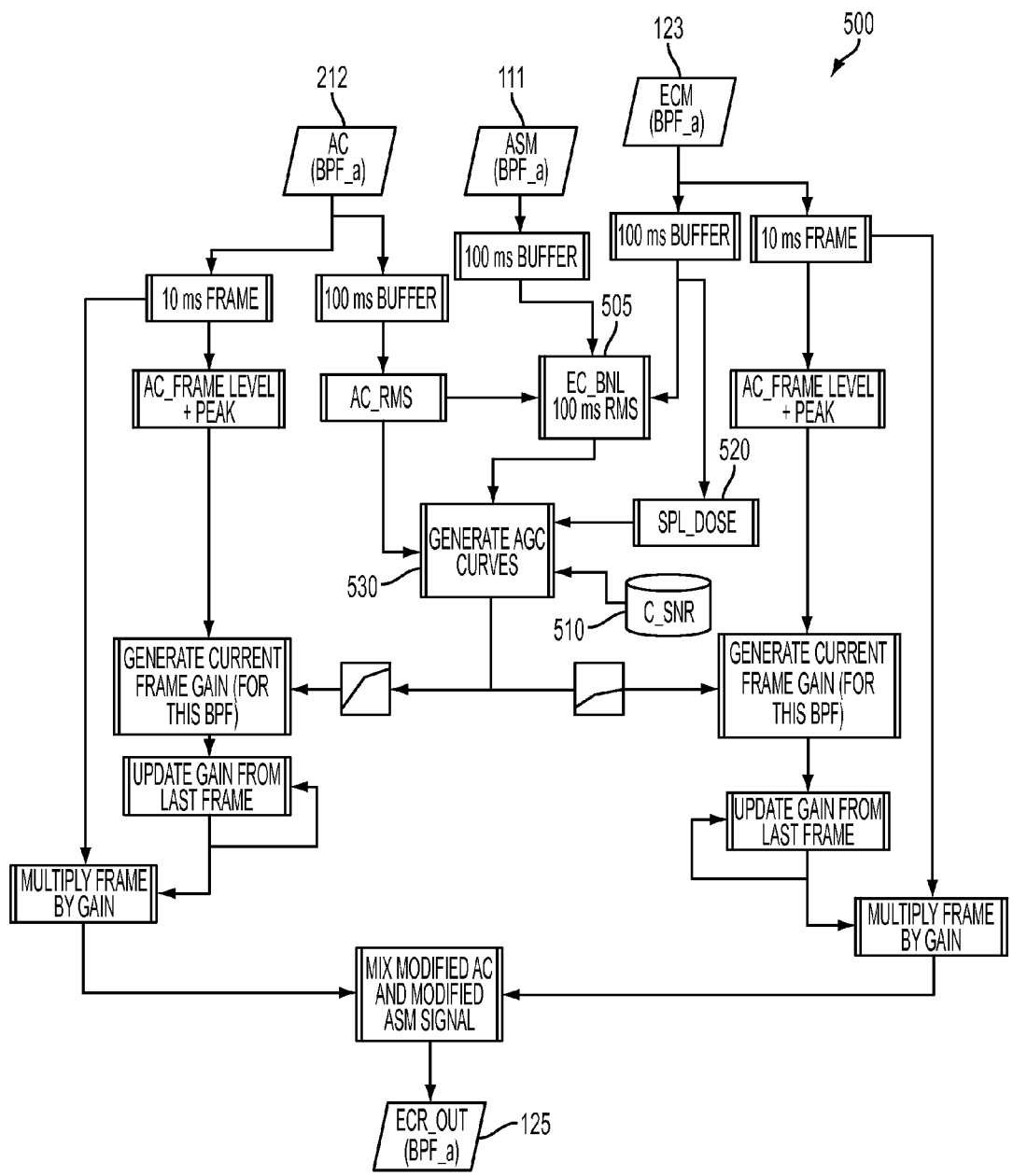
FIG. 5 is a more detailed schematic of an exemplary PHZ module implementing automatic gain compression based on sound exposure levels in accordance with an exemplary embodiment.

FIG. 5 illustrates an exemplary configuration 500 of the PHZ module shown in FIG. 3 in combination with a second "constant signal to noise ratio" (C_SNR) module 510 that mixes ambient sound detected by the ASM 111 with the AC signal from the audio interface 212 to generate a new mixed signal ECR_out which is radiated from the ECR 125. As shown, the PHZ module can estimate an Ear Canal BNL (EC_BNL) 505 from within the ear canal from both the ASM 111 and the ECM 123. The PHZ module can also estimate an SPL dose (SPL_Dose) 520 to determine sound exposure levels within the ear canal by way of the ECM 123. AGC compression curves 530 can then be generated based on the ear canal BNL 505, the SPL dose 520, and the audio content (AC_RMS) levels. The PHZ module generates the AGC compression curves 530 so as to maintain a constant signal (e.g., AC_RMS) to noise (e.g., EC_BNL) ratio. This ratio can be a preferred listening level initially set by the user.

For instance, when the user initially plays the music in a quiet environment, the C_SNR 510 establishes the ratio based on a ratio of the user's listening level with respect to the quiet background noise level. When the user then enters a noisy environment with a higher BNL, the PHZ increases the AC music level to achieve the same C_SNR as in quiet conditions. If however, the AC level generates a SPL dose that is-exceeds or is expected to increase to an unsafe listening level, the PHZ alternatively, decreases the pass through of the ASM 111 to the ECR 125. In such regard, the PHZ reduces the EC_BNL by lowering the ASM 111 to ECR 125 transparency, and thus increases the C_SNR. That is, the PHZ module 201 can perform a combination of adjusting the AC level and the ASM 111 to ECR 125 transparency to maintain a preferred listening level while maintaining safe sound exposure levels.

Figure 6:
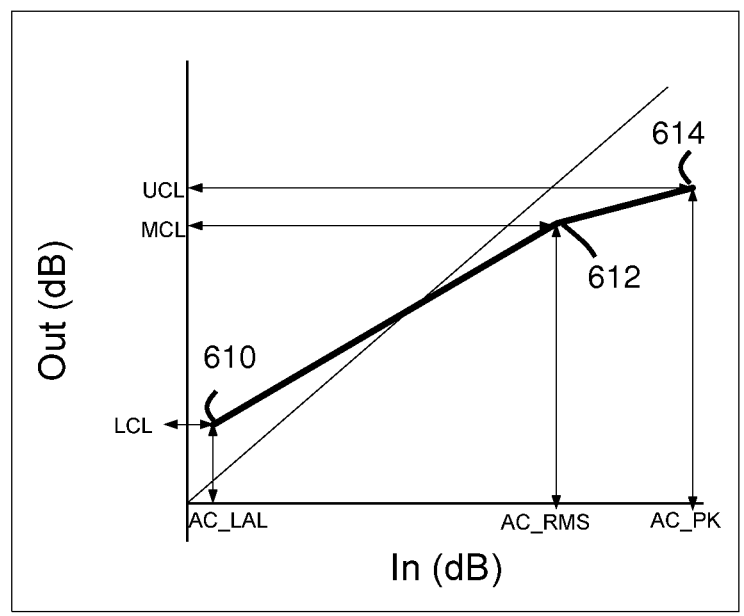
FIG. 6 is an exemplary compression curve in accordance with an exemplary embodiment.

FIG. 6 illustrates an exemplary configuration 600 of the dynamic compressor (see 360 FIG. 3) of the PHZ module 201 (see FIG. 2). As shown, the dynamic compressor maps a first input signal level (see In dB) to a second output signal level (see Out dB). The signal level can be taken as the short-term level of the input signal, e.g. averaged over 10 ms (see e.g. FIG. 5), and integrated with a previous signal level estimate. The curve that maps the input to output signal level can be defined at three locations: an input signal level AC_LAL 610, which is the Lowest Audible Level (LAL) of the input Audio Content signal, generally taken to approximate the threshold of hearing (i.e. approximately 30 dB SPL). This AC_LAL 610 is mapped to an output signal level (LCL). The second point 612 on the input-output curve is defined for an input level equal to the long-term RMS of the Audio Content signal, AC_RMS. The corresponding output level for input levels essentially equal to AC_RMS is MCL. The third point 614 of the input-output curve is defined for an input level equal to the maximum possible input level AC_PK of the original Audio Content signal that can be reproduced with the ECR without clipping (i.e. without the ECR input signal causing distortion of the radiated signal above a predetermined level, e.g. 10% harmonic distortion). The corresponding output level for AC_PK is an Uncomfortable Listening Level (UCL).

Figure 7:
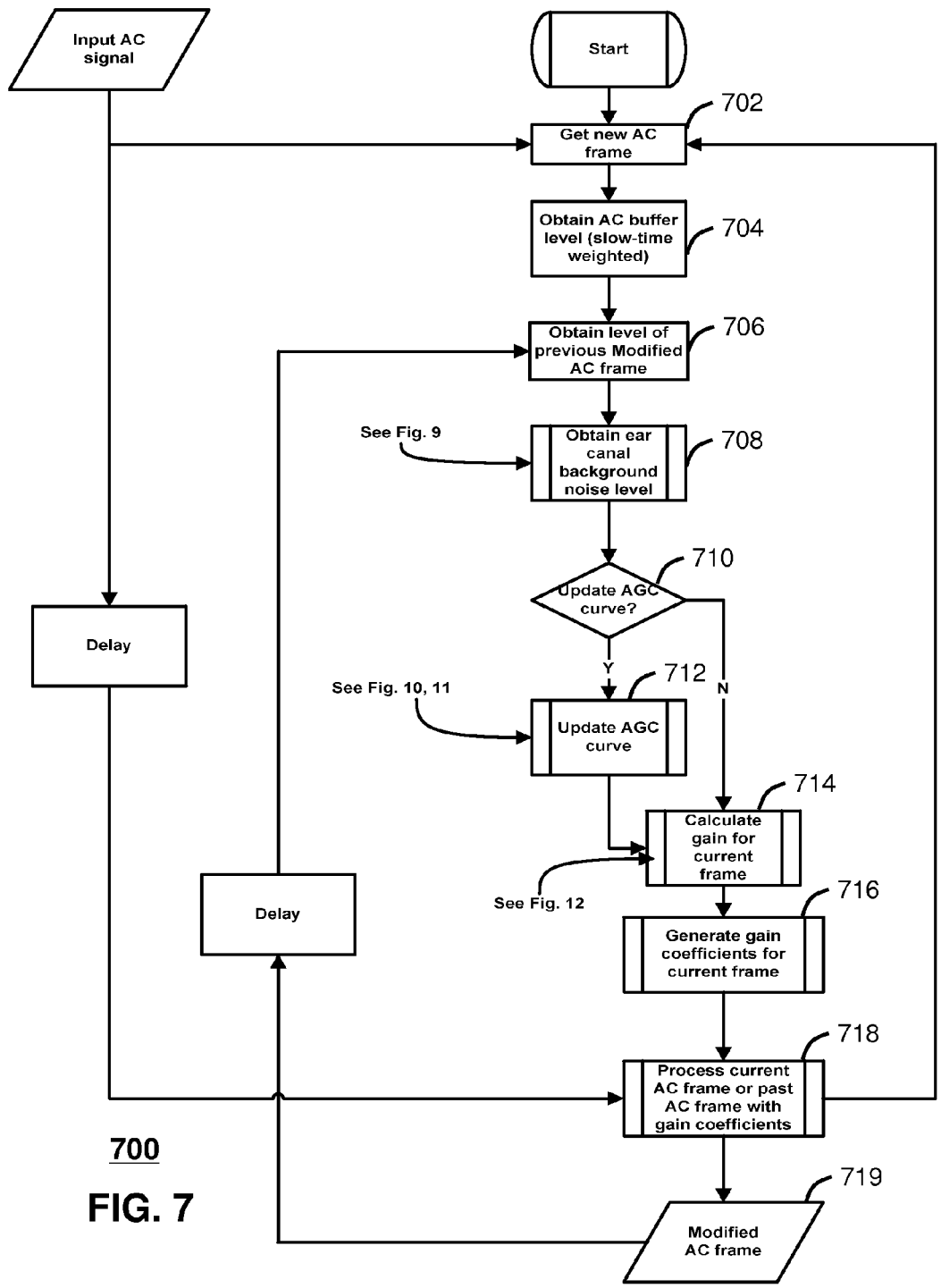
FIG. 7 is a block diagram of a method for calculating background noise levels in accordance with an exemplary embodiment.

FIG. 7 illustrates another exemplary configuration of the PHZ module 201 (see FIG. 2). FIG. 7 illustrates an example method 700 for calculating AC frame gains. As shown, a new AC signal frame (e.g. from a phone or Personal Media Player (PMP), or from a mix of two sources) is accumulated at step 702, In one embodiment, this frame is 64 samples at a 32 kHz sample rate. The level of the buffer is calculated to give a frame level, according to the exemplary method described in FIG. 8 (in the one embodiment, the temporal weighting coefficients are unity). The frame level is integrated with previous frame levels using a time smoothing coefficient, to give a slow-weighted frame level, called AC_level at step 704. For instance, the time smoothing coefficient is equal to 0.05. The level of the previous AC_ECR frame is also calculated at step 706, which is integrated with previous frame levels using a time smoothing coefficient, to give a FAST-weighted frame level, called AC_level. As an example, this time smoothing coefficient can be equal to 0.2.

Figure 10:
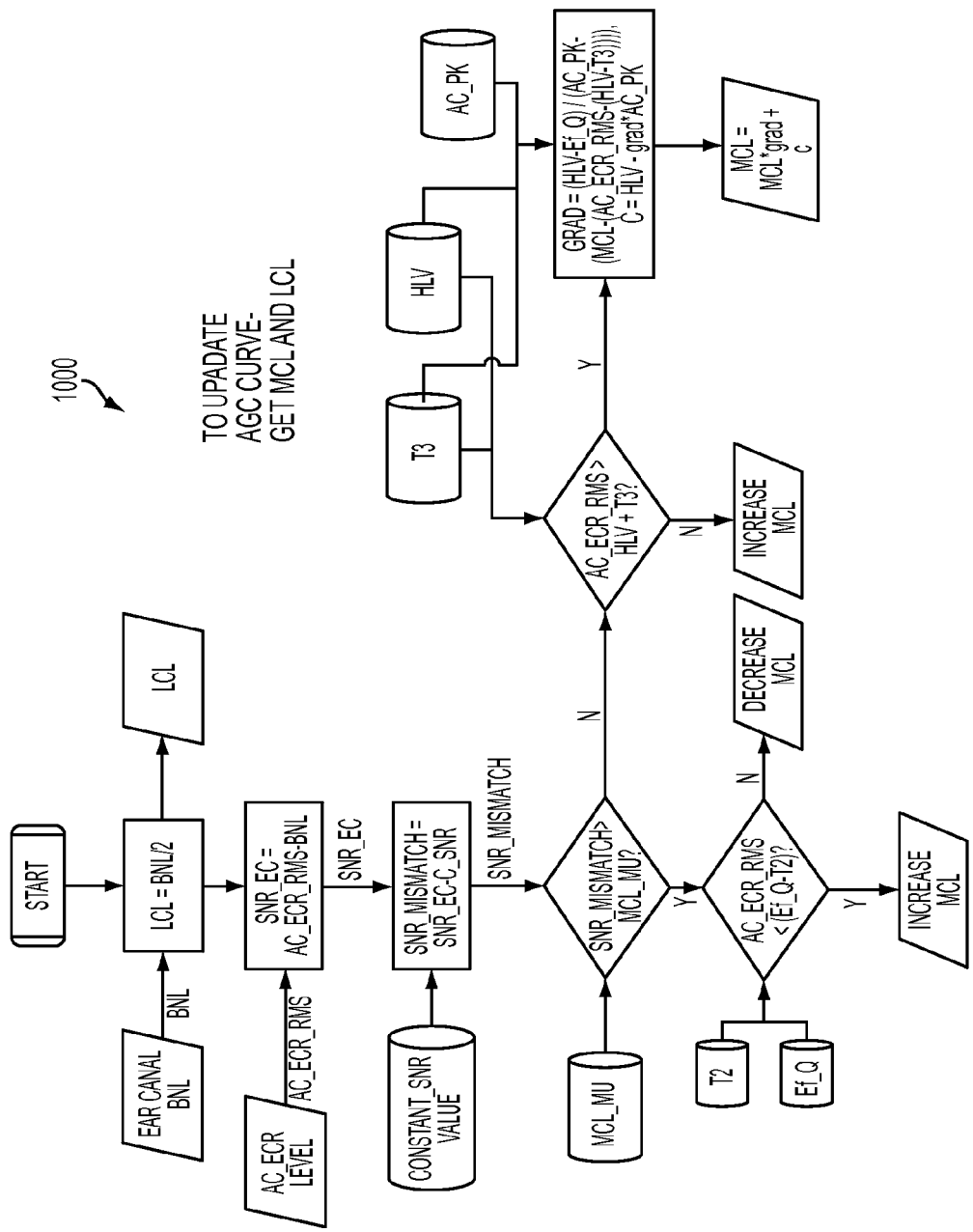
FIG. 10 is a block diagram of a flow chart for updating automatic gain control curves in accordance with an exemplary embodiment.
Figure 11:
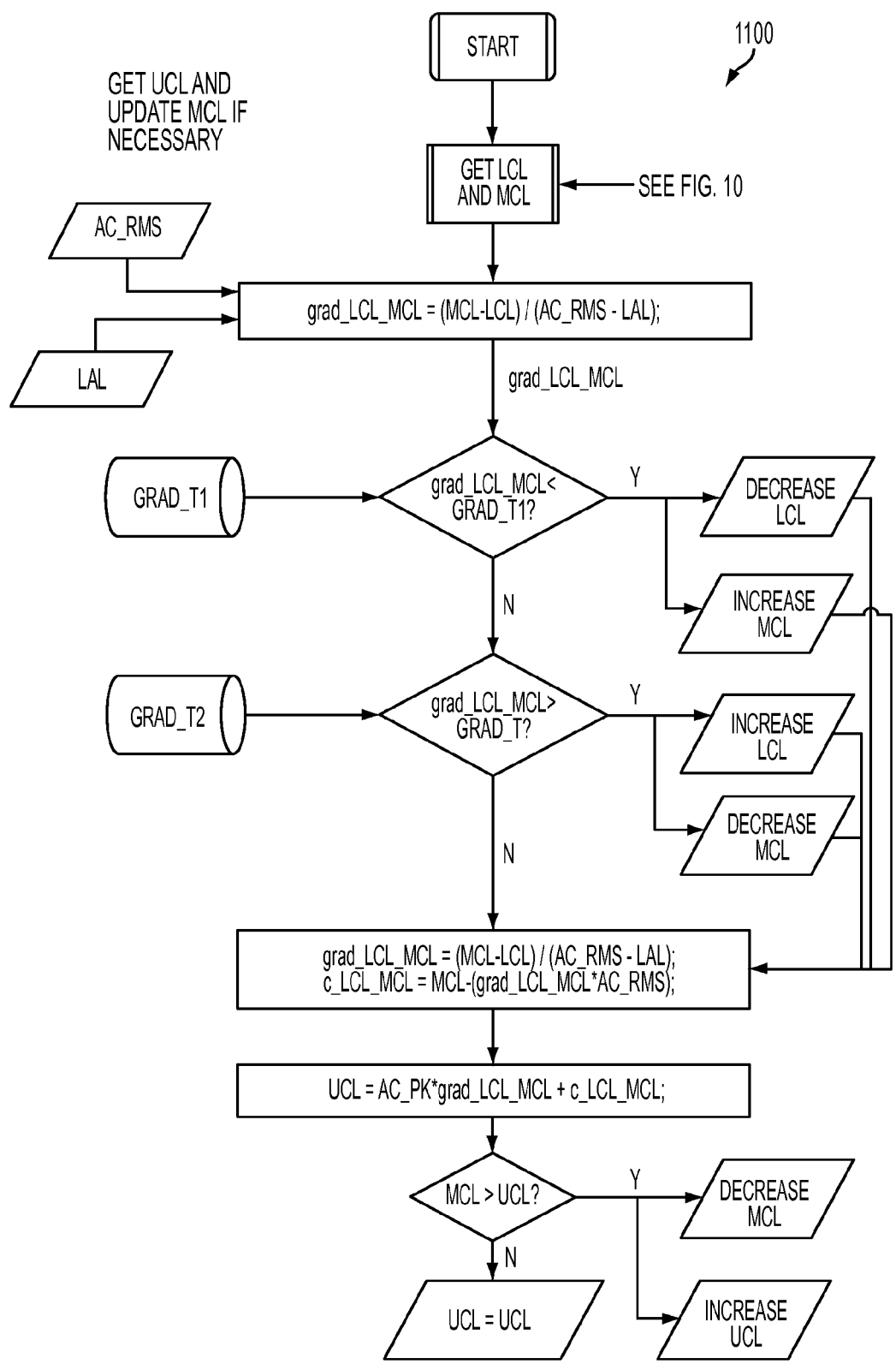
FIG. 11 is a block diagram of a flow chart for calculating parameters of a gain compression curve in accordance with an exemplary embodiment.

The ear canal BNL (see FIG. 9) is calculated at step 708, and a determination can be made if the AGC curve was updated at step 710. (The Background Noise Level in the occluded Ear Canal is calculated according to the exemplary method described in FIG. 9 to give BNL_EC. As can be seen, this method can use either the ASM or ECM signals.) If yes, the AGC curve at step 712 is updated (the process to update the input-output curve in the dynamic compressor is shown in FIGS. 10 and 11); if no, a gain at step 714 is calculated for the current frame (see FIG. 12). At step 716, the gain coefficients for the current frame are calculated therefrom. The current AC frames or past AC frame can be then processed at step 718 with the gain coefficients. The PHZ module 201 upon producing the modified AC frame at step 719 can then receive as feedback these updated gains when calculating the next frame gains.

Figure 8:
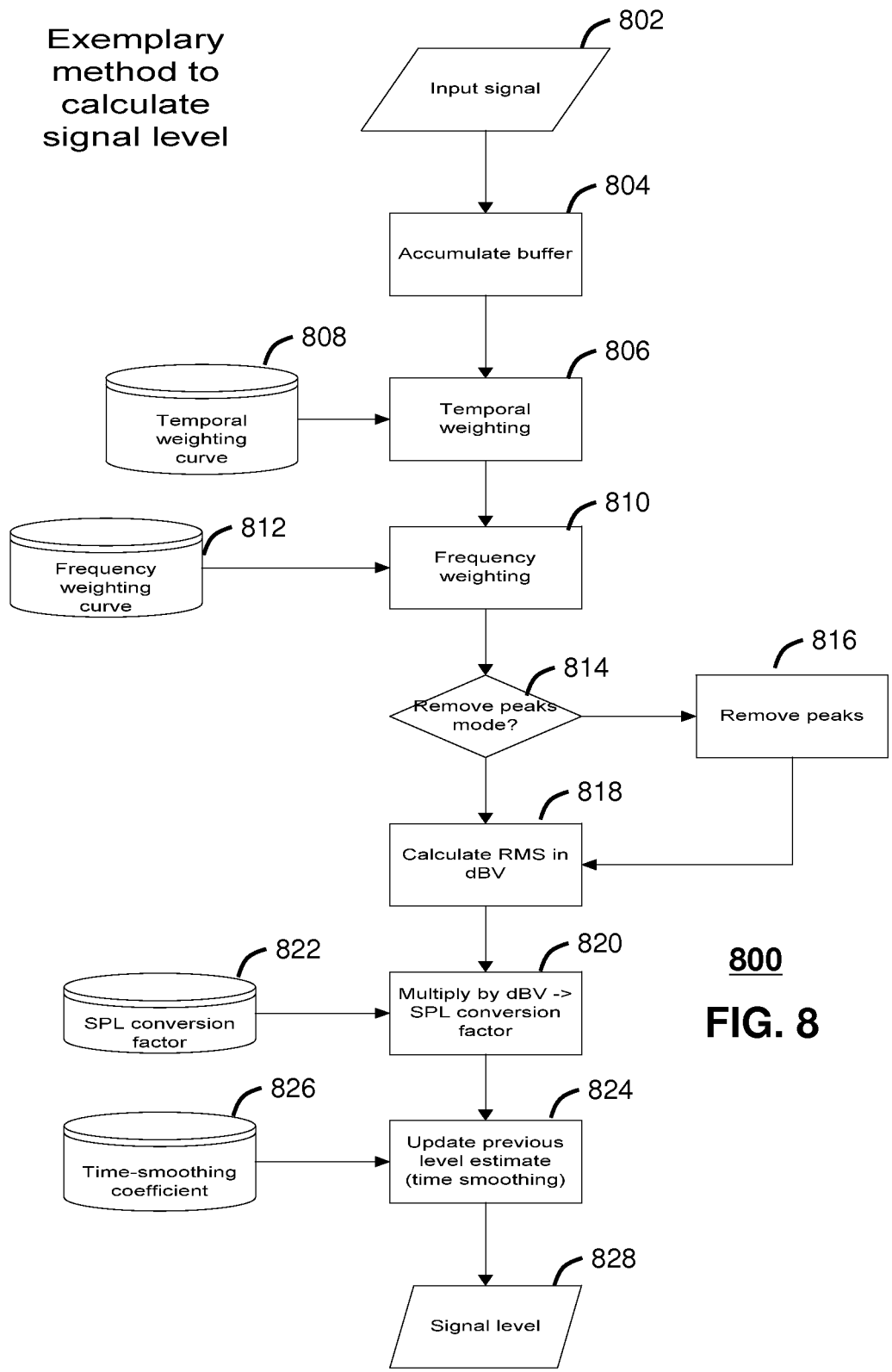
FIG. 8 is an exemplary block diagram for calculating signal level in accordance with an exemplary embodiment.

FIG. 8 shows an exemplary method 800 to calculate the signal level. Upon receiving the input signal at step 802, the input signal can be accumulated in the buffer 804. A temporal weighting can be applied 806 in accordance with a temporal weighting curve 808. A frequency weighting 810 can then be applied in accordance with a frequency weighting curve 812. If at step 814 peak mode detection is enabled the peaks can be removed at step 816. If the peaks are in the frequency domain then spectral gain techniques for example can be applied to attenuate the peaks. If the peaks are in the time domain then for example soft adaptive suppression filters can attenuate the time domain peaks.

If at step 814 peak mode detection is disabled, or the peaks have been suppressed, then the PHZ module can calculate the RMS levels at step 818. This permits a smooth estimate of the signal envelope. At step 820, the RMS level can be multiplied by an SPL conversion factor 822 to account for hearing level sensitivity (e.g., A-weighting). The previous level estimates can then be updated by time smoothing at step 824 from time smoothing coefficients 826 to produce signal level 828.

FIG. 9 is a flowchart illustrating a method 910 for estimating a Background Noise Level in an occluded Ear Canal. As shown, the method can include the step 912 of obtaining an ECM level from the ECM signal. At step 914 an AC level signal can be obtained from the audio content playing out the ECR within the ear canal. Alternatively, the AC level can be estimated from the digital AC signal sent to the ECR prior to play-out, for example, by applying an ear-canal transfer function to estimate the reproduction level within the ear canal. At step 916, the BNL ear canal level can be calculated by subtracting the AC level from the ECM level.

FIG. 9 also shows another method 950 for estimating a Background Noise Level in an occluded Ear Canal using the ASM. At step 952, the ASM level can be obtained from the ASM signal (see FIG. 8). At step 954 a Noise Reduction Rating (NRR) can be obtained. The NRR describes the effective attenuation level (e.g., 30 dB) of the material used in the earpiece 100 to seal the ear canal. At step 956, the ear canal BNL can be calculated by subtracting the NRR from the measured ASM level. This gives an indication of the residual background noise within the ear canal as heard by the user. For example, if the ambient sound in the environment is 40 dB and the earpiece provides 30 dB of NRR, then the user can hear approximately 10 dB of background noise even with the earpiece 100 inserted.

FIG. 10 is a flow chart 1000 and describes how the levels MCL (an output signal level) and LCL of the dynamic compressor shown in FIG. 6 are obtained. The value for LCL is taken as a value equal to essentially half the value of the ear-canal background noise level BNL_EC. The ear canal Signal-to-noise ratio (SNR_EC) is calculated as the difference between the level of the previous modified AC signal, AC_ECR, and the ear canal BNL, BNL_EC. The resulting difference level is compared with a threshold value called Constant_SNR, or C_SNR to give a new difference level called SNR_mismatch. If the SNR_mismatch is greater than a value equal to MCL_MU, AND if the EC_SNR is LESS than a value equal to effective quiet (EC_Q) plus a threshold value T2, then the value of MCL is increased. Alternatively, if the difference level SNR_mismatch is greater than a value equal to MCL_MU, AND if the EC_SNR is GREATER than a value equal to effective quiet (Ef_Q) plus a threshold value T2, then the value of MCL is decreased. In the preferred embodiment, the value of effective quiet Ef_Q is taken as 80 dB, and the threshold value T2 is set as 10 dB. This ensures that the level of reproduced sound does not fall below the level of Ef_Q-T2, i.e. below a level range which can be manually defined by the user as being a preferred listening level range.

If the difference level SNR_mismatch is LESS than the value MCL_MU, AND the level of AC_ECR is LESS than Effective Quiet, then we increase MCL. However, if the difference level SNR_mismatch is LESS than the value MCL_MU, AND the level of AC_ECR+T3 is GREATER than HLV, then we weight MCL so as to ensure that the reproduced audio content level (i.e. the level of the AC_ECR frame) is less than a predetermined level HLV (Hard Limit Value). HLV may be set by an additional function which calculates the sound exposure of a listener, i.e. an SPL_Dose, where a level of SPL_Dose greater than 100% predicts that a certain percentage of a healthy-eared population of individuals may suffer from noise induced hearing loss. Such a SPL_Dose function is described in related art. In the preferred embodiment, T3 is 10 dB.

The value of HLV may be adjusted over time to ensure that the earphone wearer's sound exposure is kept below a level which may cause hearing damage. Alternatively HLV may be set automatically, e.g. with a protected "parental control" mechanism, or set in the factory permanently. The "soft compression" mechanism implemented in the PHZ ensures that sound quality is maximized even though maximum level is limited.

FIG. 11 is a flow chart 1100 and shows how the value for UCL is obtained (see FIGS. 6 and 10), and how MCL can be modified further. UCL is derived by calculating the gradient of slope of the input-output curve between the LCL and MCL part of the curve, and extrapolating this curve to find the corresponding output level for AC_PK. AC_PK is taken as the maximum dB SPL level that the ECR can reproduced for a "full scale" white noise AC signal, e.g., feed the input AC signal directly to the ECR output, and the AC signal is a random noise signal with a maximum peak-peak amplitude of plus/minus 1. If the gradient of LCL>MCL is less than a predetermined threshold T1 (in the preferred embodiment, equal to 0.1) then we decrease the value of LCL and increase the level of MCL. If the gradient of LCL>MCL is GREATER than a predetermined threshold T1 (in the preferred embodiment, equal to 10) then we increase the value of LCL and decrease the level of MCL, before calculating UCL.

Figure 12:
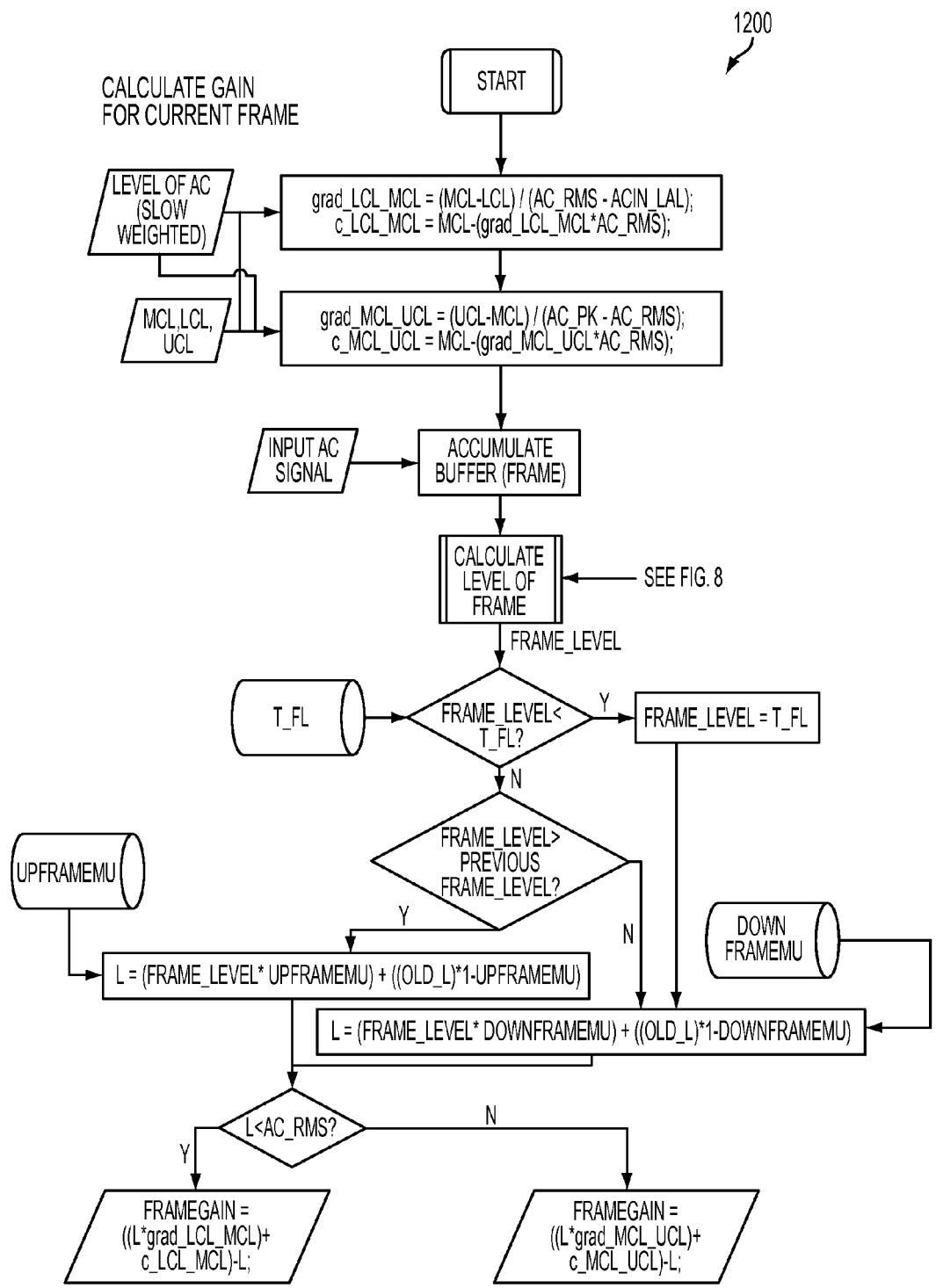
FIG. 12 is a block diagram of a flow chart for calculating gain in accordance with an exemplary embodiment.

FIG. 12 is a flow chart 1200 that describes a process to calculate the gain for a current input AC frame. The slow weighted level of the input AC is calculated as previously described, to give the level AC_RMS. The frame level is also calculated. If this frame level is below a threshold level T_FL then the frame level is set to T_FL. In the preferred embodiment, this T_FL value is set to 30 dB. If the frame level is greater than the previous averaged frame level, then the current estimate of the averaged frame level is increased by integrating the frame level with the previous averaged frame level time weighting coefficient upFrameMU. If the frame level is LESS than the previous averaged frame level, then the current estimate of the averaged frame level is decreased by integrating the frame level with the previous averaged frame level time weighting coefficient downFrameMU, where upFrameMU controls the "attack" time constant, and down-FrameMU controls the "decay" time constant. The resulting averaged frame level L is then used to calculate a frameGainusing the LCL-MCL curve if L is less than AC_RMS, and using the MCL-UCL curve if L is greater than AC_RMS.

FIG. 13 show two exemplary waveforms for an ASM signal and an AC signal (20 second excerpt). Plot 1300 shows an ASM signal as measured by the earpiece 100. Plot 1350 shows an audio content input signal as presented by the audio content interface 212 to the earpiece 100 for delivery to the ear canal by way of the ECR 125.

Figure 14:
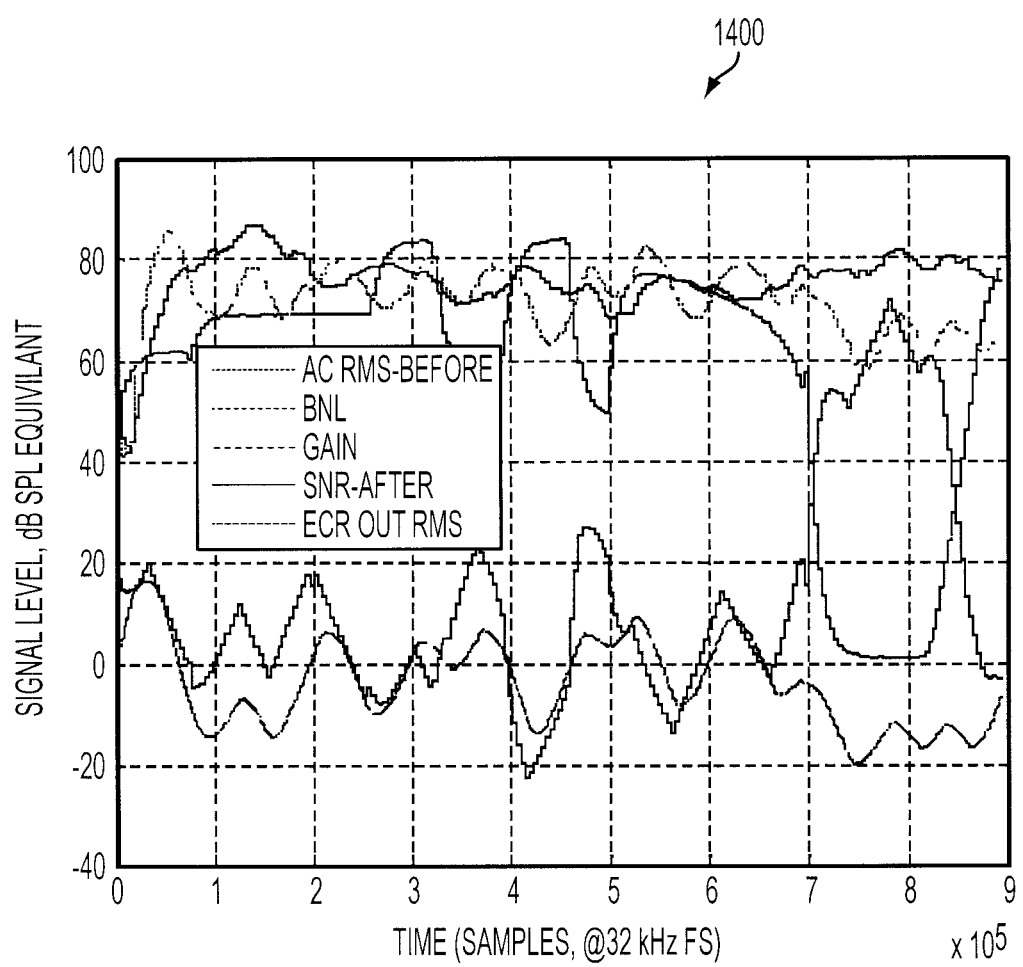
FIG. 14 presents simulation plots for audio signals processed in accordance with an exemplary embodiment of the PHZ module.

FIG. 14 shows signal plots 1400 as processed by the PHZ module 201 (FIG. 2). Plots for audio content (AC-RMS), Background Noise Level (BNL), Gain, SNR-after, and ECR output RMS are shown. The latter signal is the PHZ processed signal output to the ECR and played within the ear canal. The time-varying level of the input signals illustrate how a frame Gain changes over time.

Figure 15:
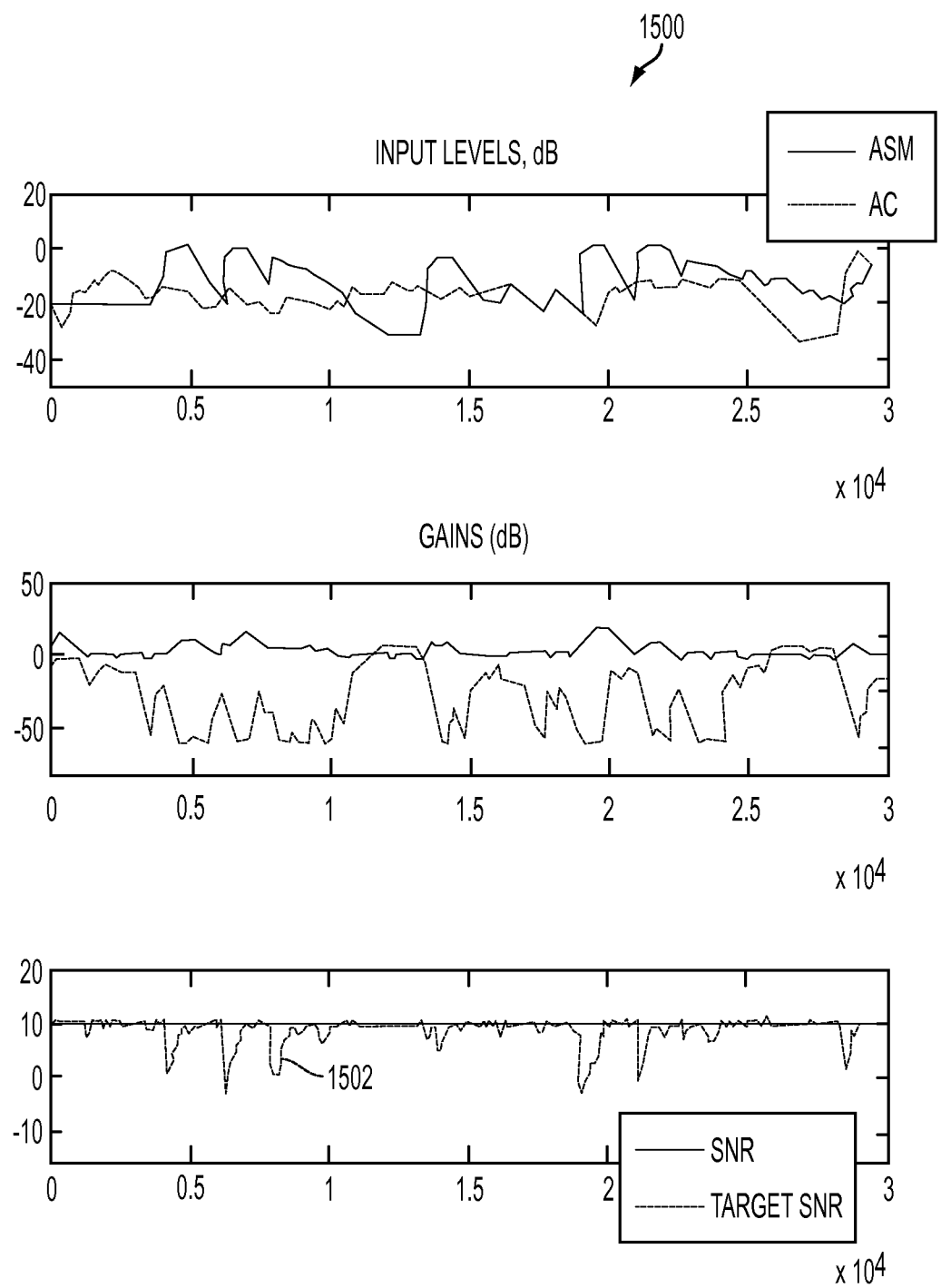
FIG. 15 presents simulation plot results for maintaining a constant signal to noise ration in accordance with an exemplary embodiment of the PHZ module.

FIG. 15 illustrates are plots 1500 which illustrate measured input signals and processed output signals according to PHZ module 201 (FIG. 2). The top subplot shows the ASM and AC signals as measured by the earpiece. The signals are seen to vary over time. The middle subplot shows the respective gain changes applied to each of the ASM and AC signals. The bottom subplot shows the resulting SNR and target SNR set for achieving a constant signal to noise ratio. Signal 1502 is the simulated SNR level which converges to the constant 10 dB target SNR albeit a few deviations due to abrupt changes in BNL. This slight deviation however permits the user to briefly hear abrupt ambient conditions, for example, those corresponding to warning sounds thereby providing a degree of situational awareness.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions of the relevant exemplary embodiments. Thus, the description of the invention is merely exemplary in nature and, thus, variations that do not depart from the gist of the invention are intended to be within the scope of the exemplary embodiments of the present invention. Such variations are not to be regarded as a departure from the spirit and scope of the present invention.

What is claimed is:

1. A method to control a level of audio reproduction within an occluded ear canal, the method comprising the steps of:
measuring an ambient sound level of ambient sound from an Ambient Sound Microphone (ASM) at an entrance to the occluded ear canal;
determining a residual background noise level within the occluded ear canal from at least one of an Ear Canal Microphone (ECM) or the ASM;
measuring a level of audio content delivered to the occluded ear canal;
mixing the ambient sound with the audio content to form a mixed signal that is reproduced within the occluded ear canal;
adjusting, in the mixed signal, a gain of at least one of the audio content or the ambient sound based on the residual background noise level and the level of the audio content such that the level of audio reproduction of the mixed signal is maintained within a predetermined listening level range over time;
adjusting a pass-through gain of the ambient sound from the ASM to an Ear Canal Receiver (ECR) to decrease a reproduction gain of the ambient sound in the occluded ear canal;
measuring a first level of an audio content signal of the audio content using a slow time weighting function to produce a signal AC_RMS; and
measuring a second level of the audio content signal using a fast time weighting function to produce a signal Frame-RMS.

2. The method of claim 1, wherein the step of measuring the level of the audio content includes:
measuring a digital level of the audio content prior to audible reproduction out of an Ear Canal Receiver (ECR); and
compensating the digital level by applying an Ear Canal Transfer function (ECTF) of the occluded ear canal to the audio content to estimate an audible level of the audio content within the occluded ear canal.

3. The method of claim 1, wherein the step of measuring the level of the audio content includes:
measuring an analog level of the audio content reproduced in the occluded ear canal during periods of relatively low ambient sound.

4. The method of claim 1, where the step of adjusting the gain further comprises:
assessing a sound exposure level to ensure the gain does not exceed a safe listening level.

5. The method of claim 1, where the step of adjusting the gain further comprises:
increasing the gain of the audio content if the residual background noise level within the occluded ear canal increases so as to achieve a constant ratio of the level of the audio content to the residual background noise level; or
decreasing the gain of the audio content if the residual background noise level within the occluded ear canal decreases so as to achieve the constant ratio.

6. The method of claim 1, further comprising:
assessing a sound exposure level within the occluded ear canal; and
decreasing the pass-through gain if the sound exposure level is greater than or equal to a safe listening level.

7. The method of claim 1, further comprising:
increasing the gain of the audio content if the residual background noise level within the occluded ear canal increases so as to achieve a constant ratio of the level of the audio content to the residual background noise level, while
decreasing the pass-through gain if the sound exposure level is greater than or equal to a safe listening level.

8. The method of claim 1, further comprising:
measuring an ear canal background noise level to produce a third level EC_BNL; and
measuring a forth level of the audio content signal using a fast time weighting function to give a level AC_ECR.

9. The method of claim 1, further comprising dynamically compressing a delayed input audio content signal to produce a modified audio content signal, where the compressing maps an input signal level to an output signal level at three points including:
a first input signal level AC_LAL, which is a lowest audible level of the audio content signal, taken to approximate a threshold of hearing;
a second input level equal to a long-term RMS of the signal AC_RMS, and
a third input level equal to a maximum possible input level AC_PK of the audio content signal reproduced with the ECR.

10. The method of claim 9, where the threshold of hearing is about 30 dB SPL.

11. The method of claim 9, where the maximum possible input level AC_PK does not clip, cause distortion above a predetermined level, or exceed an uncomfortable listening level.

12. The method of claim 9, where the compressing is dynamically performed across sub-bands of the audio content signal.

13. The method of claim 9, where the audio content is received from at least one of a mobile device, a laptop, a cell phone, a media player, or a computer.

14. A method to control a level of audio reproduction within an occluded ear canal, the method comprising the steps of:
delivering audio content to the occluded ear canal;
measuring an ambient sound level of ambient sound from an Ambient Sound Microphone (ASM) at an entrance to the occluded ear canal;
determining a residual background noise level within the occluded ear canal from at least one of an Ear Canal Microphone (ECM) or the ASM;
determining a sound exposure level of the audio content delivered to the occluded ear canal;
mixing the ambient sound with the audio content to form a mixed signal that is reproduced within the occluded ear canal;
adjusting, in the mixed signal, a gain of at least one of the audio content or the ambient sound based on the residual background noise level and the sound exposure level such that the level of audio reproduction of the mixed signal is maintained within a preferred listening level and within a safe listening level over time;
identifying periods of silence in the audio content;
estimating the residual background noise level within the occluded ear canal during the silence; and
updating the sound exposure level for the residual background noise level.

15. The method of claim 14, comprising:
subtracting a frequency-dependant or signal-valued attenuation of an ear sealing from the ambient sound level to determine the residual background noise level within the occluded ear canal.

16. The method of claim 14, comprising:
subtracting an equivalent Sound Pressure Level (SPL) of the audio content from the sound exposure level of the audio content to determine the residual background noise level within the occluded ear canal.

17. An earpiece comprising:
an Ambient Sound Microphone (ASM) configured to measure ambient sound at an entrance to an occluded ear canal and produce an electronic ambient signal;
an Ear Canal Receiver (ECR) configured to deliver audio content to the occluded ear canal;
an Ear Canal Microphone (ECM) configured to measure sound in the occluded ear canal and produce an electronic internal signal; and
a processor operatively coupled to the ASM, the ECM and the ECR where the processor is configured to:
determine a residual background noise level within the occluded ear canal by at least one of the ECM or the ASM;
determine a sound exposure level of the audio content delivered to the occluded ear canal;
mix the ambient sound with the audio content to form a mixed signal that is reproduced within the occluded ear canal;
adjust, in the mixed signal, a gain of at least one of the audio content or the ambient sound based on the residual background noise level and the sound exposure level such that reproduction of the mixed signal in the occluded ear canal is maintained within a preferred listening level and within a safe listening level over time; and
apply dynamic compression to the audio content at three points along a compression curve including:
a first input level AC_LAL point, which is a lowest audible level of an audio content signal of the audio content, taken to approximate a threshold of hearing;
a second input level point equal to a long-term RMS of the audio content signal, AC_RMS, and
a third input level point equal to a maximum possible input level AC_PK of the audio content signal reproduced with the ECR.

18. The earpiece of claim 17, where a first value of an output level signal (LCL) of the audio content responsive to the dynamic compression is about half a value of the residual background noise level (EC_BNL), and a second value of the LCL is about half a value of an audio content lowest audible level (AC_LAL).

19. The earpiece of claim where 17, value of the second input level point is increased when a level difference between the audio content and the residual background noise level (EC_BNL) is less than a predetermined threshold value C_SNR, where C_SNR is manually set by a user of the earpiece.

20. The earpiece of claim 17, where a value of the second input level point is decreased when a level difference between the audio content and the residual background noise level (EC_BNL) is greater than a predetermined threshold value C_SNR.

21. The earpiece of claim 17, where a value of the third input level point is derived by calculating a gradient of a slope of an input-output curve of the dynamic compression between the first input level point and of the second input level point of the curve, and extrapolating this curve to find the corresponding output level for the AC_PK.

* * * * *